(12) United States Patent
Mueller et al.

(10) Patent No.: US 11,133,303 B2
(45) Date of Patent: Sep. 28, 2021

(54) SEMICONDUCTOR DEVICE AND SEMICONDUCTOR ARRANGEMENT COMPRISING SEMICONDUCTOR DEVICES

(71) Applicant: Infineon Technologies AG, Neubiberg (DE)

(72) Inventors: Christian Robert Mueller, Schweinfurt (DE); Stefan Buschhorn, Petershagen (DE); Johannes Georg Laven, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/893,058

(22) Filed: Jun. 4, 2020

(65) Prior Publication Data

US 2020/0388612 A1 Dec. 10, 2020

(30) Foreign Application Priority Data

Jun. 7, 2019 (EP) .................................. 19178929

(51) Int. Cl.
  *H01L 29/74* (2006.01)
  *H01L 27/06* (2006.01)
  *H01L 29/423* (2006.01)
(52) U.S. Cl.
  CPC ...... *H01L 27/0647* (2013.01); *H01L 27/0623* (2013.01); *H01L 27/0629* (2013.01); *H01L 29/4236* (2013.01)
(58) Field of Classification Search
  CPC ............. H01L 27/0647; H01L 27/0623; H01L 27/0629; H01L 29/4236; H01L 25/18; H01L 29/407; H01L 29/7805; H01L 29/7813; H01L 25/072; H01L 29/417; H01L 29/0653; H01L 29/404; H01L 29/42376; H01L 29/7397; H01L 29/0696; H01L 29/0834; H01L 29/8613;
(Continued)

(56) References Cited

U.S. PATENT DOCUMENTS

2008/0048295 A1 2/2008 Takahashi
2009/0200608 A1* 8/2009 Shirai ..................... H01L 29/20
  257/334
(Continued)

FOREIGN PATENT DOCUMENTS

WO 2012017878 A1 2/2012

*Primary Examiner* — Shouxiang Hu
(74) *Attorney, Agent, or Firm* — Murphy, Bilak & Homiller, PLLC (57) ABSTRACT

An embodiment of a semiconductor device includes a plurality of transistor sections separated from each other and a plurality of diode sections separated from each other. Each transistor section includes an emitter electrode and a collector electrode. Each diode section includes an anode electrode and a cathode electrode. Each transistor section is electrically coupled to a common gate pad. A ratio between an active transistor part and an active diode part of the semiconductor device is adjustable by activating a first number of the transistor sections by selectively contacting the emitter electrodes and the collector electrodes of the first number of transistor sections, and by activating a second number of the diode sections by selectively contacting the anode electrodes and the cathode electrodes of the second number of diode sections.

21 Claims, 6 Drawing Sheets

(58) Field of Classification Search
CPC ............... H01L 29/861; H01L 27/0664; H01L 27/0727; H01L 2924/1305
See application file for complete search history.

(56) References Cited

U.S. PATENT DOCUMENTS

2012/0286290 A1* 11/2012 Uchida ............. H01L 29/66068
  257/77
2014/0103393 A1* 4/2014 Pavier ................... H01L 25/072
  257/140
2015/0349112 A1 12/2015 Grebs et al.

* cited by examiner

FIG 14

SEMICONDUCTOR DEVICE AND SEMICONDUCTOR ARRANGEMENT COMPRISING SEMICONDUCTOR DEVICES

TECHNICAL FIELD

The instant disclosure relates to a semiconductor device and to a semiconductor arrangement comprising a plurality of semiconductor devices, in particular semiconductor devices including reverse conducting transistor devices.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate. The controllable semiconductor devices are usually mounted to the semiconductor substrate by soldering or sintering techniques.

Many semiconductor arrangements include switching elements such as MOSFETs or IGBTs with a freewheeling diode coupled in parallel to each of the switching elements. In some applications, using a reverse conducting (RC) IGBT with (RCDC IGBT) or without (RCD IGBT) diode control may be advantageous. RC IGBTs generally combine the transistor part and the diode part within a single chip. RC IGBTs offer thermal advantages, e.g., because of their combined total area (diode area+IGBT area). The lifetime of RC IGBTs often is greater as compared to conventional IGBTs.

A disadvantage of conventional RC IGBTs, however, can be seen in the set ratio between IGBT area and diode area within a single chip after production.

There is a need for a semiconductor device including an RC IGBT device with a variable ratio between IGBT area and diode area.

SUMMARY

A semiconductor device includes a plurality of transistor sections that are separated from each other, wherein each of the plurality of transistor sections includes an emitter electrode and a collector electrode, and a plurality of diode sections that are separated from each other, wherein each of the plurality of diode sections includes an anode electrode and a cathode electrode. Either, each of the plurality of transistor sections is electrically coupled to a common gate pad, and a resulting ratio between an active transistor part and an active diode part of the semiconductor device may be adjusted by activating a first number of transistor sections by selectively contacting the emitter electrodes and the collector electrodes of the first number of transistor sections, and by activating a second number of diode sections by selectively contacting the anode electrodes and the cathode electrodes of the second number of diode sections.

Another semiconductor device includes a plurality of transistor sections that are separated from each other, wherein each of the plurality of transistor sections includes an emitter electrode, a collector electrode, and a gate pad, and a plurality of diode sections that are separated from each other, wherein each of the plurality of diode sections includes an anode electrode and a cathode electrode. A ratio between an active transistor part and an active diode part of the semiconductor device may be adjusted by activating a first number of transistor sections by selectively contacting the emitter electrodes, the collector electrodes, and the gate pads of the first number of transistor sections, and by activating a second number of diode sections by selectively contacting the anode electrodes and the cathode electrodes of the second number of diode sections.

A semiconductor arrangement includes a plurality of identical semiconductor devices operatively coupled in parallel between a first electrical potential and a second electrical potential. Each of the plurality of semiconductor devices includes a plurality of transistor sections that are separated from each other, wherein each of the plurality of transistor sections includes an emitter electrode, a collector electrode, and a gate pad, and a plurality of diode sections that are separated from each other, wherein each of the plurality of diode sections includes an anode electrode and a cathode electrode. A ratio between an active transistor part and an active diode part of each semiconductor device may be adjusted by activating a first number of transistor sections by selectively contacting the emitter electrodes, the collector electrodes, and the gate pads of the first number of transistor sections, and by activating a second number of diode sections by selectively contacting the anode electrodes and the cathode electrodes of a second number of diode sections. The ratio between the active transistor part and the active diode part is identical for all of the plurality of semiconductor devices, and the number of active transistor sections and active diode sections is different for at least two of the plurality of semiconductor devices.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element". "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
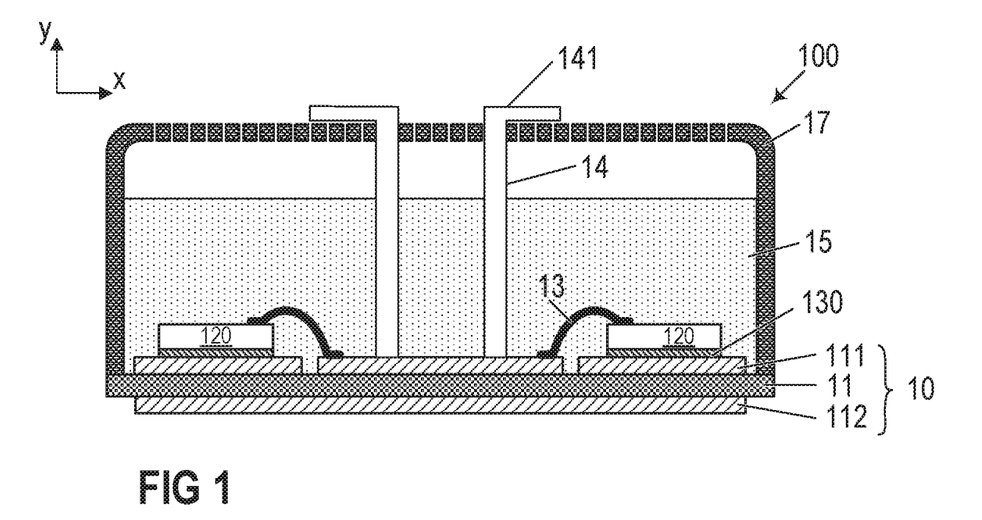
FIG. 1 is a cross-sectional view of a power semiconductor module arrangement.

Referring to FIG. 1, a cross-sectional view of a power semiconductor module arrangement 100 is schematically illustrated. The power semiconductor module arrangement 100 includes a housing 17 and a semiconductor substrate 10. The semiconductor substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper: a copper alloy: aluminum: an aluminum alloy; any other metal or alloy that remains solid during the operation of the power semiconductor module arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminum oxide: aluminum nitride; zirconium oxide; silicon nitride; boron nitride, or any other dielectric ceramic. For example, the dielectric insulation layer 11 may consist of or include one of the following materials: $Al_2O_3$, AN SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The semiconductor substrate 10 is arranged in a housing 17. In the example illustrated in FIG. 1, the semiconductor substrate 10 forms a ground surface of the housing 17, while the housing 17 itself solely comprises sidewalls and a cover. This is, however, only an example. It is also possible that the housing 17 further comprises a ground surface and the semiconductor substrate 10 be arranged inside the housing 17. According to another example, the semiconductor substrate 10 may be mounted on a base plate (not illustrated). In some power semiconductor module arrangements 100, more than one semiconductor substrate 10 is arranged on the ground surface of a housing 17 or on a single base plate (not illustrated). The base plate may form a ground surface of the housing 17, for example.

One or more semiconductor bodies 120 may be arranged on the at least one semiconductor substrate 10. Each of the semiconductor bodies 120 arranged on the at least one semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), and/or any other suitable semiconductor element.

The one or more semiconductor bodies 120 may form a semiconductor arrangement on the semiconductor substrate 10. In FIG. 1, only two semiconductor bodies 120 are exemplarily illustrated. The second metallization layer 112 of the semiconductor substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. This, however, is only an example. Any other number of sections is possible. Different semiconductor bodies 120 may be mounted to the same or to different sections of the first metallization layer 111. Different sections of the first metallization layer may have no electrical connection or may be electrically connected to one or more other sections using, e.g., bonding wires 13. Electrical connections 13 may also include connection plates or conductor rails, for example, to name just a few examples. The one or more semiconductor bodies 120 may be electrically and mechanically connected to the semiconductor substrate 10 by an electrically conductive connection layer 130. Such an electrically conductive connection layer may be a solder layer, a layer of an electrically conductive adhesive, or a layer of a sintered metal powder, e.g., a sintered silver powder, for example.

According to other examples, it is also possible that the second metallization layer 112 is a structured layer. It is further possible to omit the second metallization layer 112 altogether. It is also possible that the first metallization layer 111 is a continuous layer, for example.

The power semiconductor module arrangement 100 illustrated in FIG. 1 further includes terminal elements 14. The terminal elements 14 are electrically connected to the first metallization layer 111 and provide an electrical connection between the inside and the outside of the housing 17. The terminal elements 14 may be electrically connected to the first metallization layer 111 with a first end, while a second end 141 of the terminal elements 14 protrudes out of the housing 17. The terminal elements 14 may be electrically contacted from the outside at their second end 141. A first part of the terminal elements 14 may extend through the inside of the housing 17 in a vertical direction y. The vertical direction y is a direction perpendicular to a top surface of the semiconductor substrate 10, wherein the top surface of the semiconductor substrate 10 is a surface on which the at least one semiconductor body 120 is mounted. The terminal elements 14 illustrated in FIG. 1, however, are only examples. Terminal elements 14 may be implemented in any other way and may be arranged anywhere within the housing 17. For example, one or more terminal elements 14 may be arranged close to or adjacent to the sidewalls of the housing 17. Terminal elements 14 could also protrude through the sidewalls of the housing 17 instead of through the cover.

The semiconductor bodies 120 each may include a chip pad metallization (not specifically illustrated), e.g., a source, drain, anode, cathode or gate metallization. A chip pad metallization generally provides a contact surface for electrically connecting the semiconductor body 120. The chip pad metallization may electrically contact a connection layer 130, a terminal element 14, or an electrical connection 13, for example. A chip pad metallization may consist of or include a metal such as aluminum, copper, gold or silver, for example. The electrical connections 13 and the terminal elements 14 may also consist of or include a metal such as copper, aluminum, gold, or silver, for example.

Figure 2:
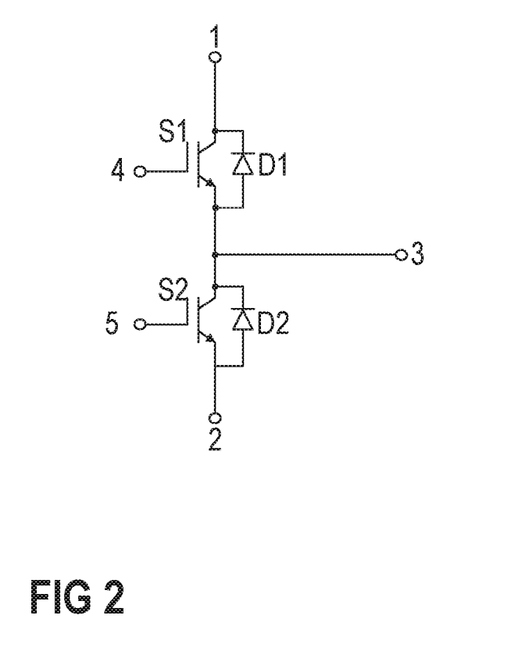
FIG. 2 schematically illustrates a circuit arrangement according to one example.

Now referring to FIG. 2 and as has been mentioned above, the at least two semiconductor bodies 120 may be arranged in a semiconductor arrangement such as a half-bridge configuration, for example. FIG. 2 is a circuit diagram of an exemplary half-bridge arrangement.

The half-bridge arrangement is configured to convert a DC voltage provided at an input 1, 2 of the half-bridge arrangement into an AC voltage provided at an output 3 of the half-bridge arrangement. The AC voltage may be provided to, e.g., a load (not illustrated) that is coupled to the output 3 of the half-bridge arrangement. The half-bridge arrangement is coupled between a first supply node 1 which is configured to be operatively coupled to a first electrical potential and a second supply node 2 which is configured to be operatively coupled to a second electrical potential. The first electrical potential may be a positive potential DC+ and the second electrical potential may be a negative potential DC− to supply a DC voltage via the first and second supply nodes 1, 2. The first and second supply nodes 1, 2 form the input of the half-bridge arrangement.

The half-bridge may include one high-side switch S1 (first switch) and one low-side switch S2 (second switch) coupled in series to each other and between the first supply node 1 and the second supply node 2. The half-bridge arrangement may be configured to drive a load (not specifically illustrated) at its output node 3. The load may be an inductive load, for example. The output node 3 is electrically connected to a common node between the high-side switch S1 and the low-side switch S2.

In the circuit arrangement of FIG. 2, each switch S1, S2 of the half-bridge arrangement is implemented as an IGBT (insulated-gate bipolar transistor). Each of the switches S1, S2 may comprise an internal or external freewheeling diode. According to another example, each of the switches S1, S2 comprises two or more separate switching elements electrically coupled in parallel to each other (not illustrated).

Each of the first switch S1 and the second switch S2 includes a control electrode 4, 5 and a controllable load path between a first load electrode and a second load electrode. The load paths of the first switch S1 and the second switch S2 are coupled in series and between the first supply node 1 and the second supply node 2.

Each of the first switch S1 and the second switch S2 may comprise at least one reverse conducting (RC) IGBT with (RCDC IGBT) or without (RCD IGBT) diode control. An RC IGBT may provide advantages in terms of high power density and efficiency, long lifecycle and reliability, temperature behavior and reduced system costs as compared to conventional IGBTs, for example. An RC IGBT combines both the transistor and the freewheeling functionality in a single semiconductor chip. An increased current density is obtained by more active silicon area in forward and reverse direction. As a result of the integration of transistor and freewheeling functionality on a single semiconductor chip, the diode's electrical performance can be influenced by the control state of the IGBT gate.

Figure 3:
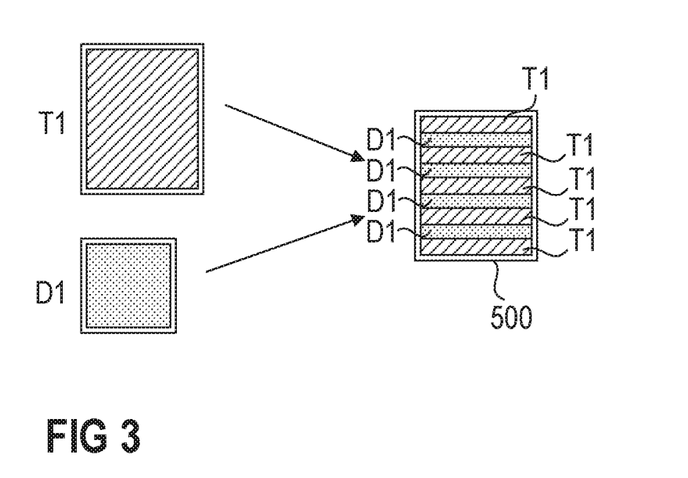
FIG. 3 schematically illustrates the principle of an RC IGBT having a stripe pattern.

An example of a semiconductor device 500 combining transistor and diode functionality is schematically illustrated in FIG. 3. In particular, separate transistor T1 and diode D1 chips are integrated in a single semiconductor device 500. In the example illustrated in FIG. 3, the semiconductor device 500 comprises a plurality of transistor sections T1 and a plurality of diode sections D1. The transistor sections T1 and the diode sections D1 are arranged alternatingly in a stripe pattern.

Figure 4:
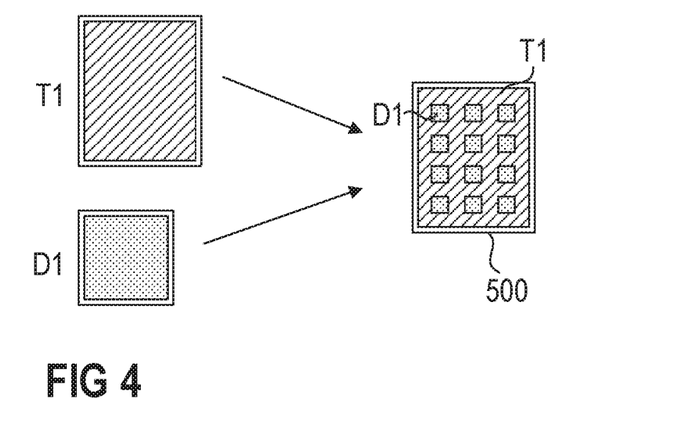
FIG. 4 schematically illustrates the principle of an RC IGBT having a diode island design.

According to another example, as is schematically illustrated in FIG. 4, the semiconductor device 500 may comprise a single transistor section T1 and a plurality of diode sections D1 that are arranged as individual islands within the transistor section T1.

When manufacturing the semiconductor device 500, a certain ratio between the transistor part and the diode part is chosen and the design adapted accordingly. The transistor part and the diode part in this context does not necessarily refer to the actual size of the transistor sections T1 and the diode sections D1, but rather refers to the respective nominal currents. That is, when a ratio of 1:1 is chosen, the nominal current of the transistor section T1 is identical to the nominal current of the diode section D1. The ratio does not necessarily apply to the actual surface area of the transistor and the diode sections T1, D1 needed on the semiconductor chip. That is, when a ratio of 1:1 is chosen, the surface area of the transistor section T1 on the semiconductor device 500 may be larger or smaller than the surface area of the diode section D1 on the semiconductor device.

A ratio of 1:1 may be appropriate for motor or generator applications, for example. A customer previously using a semiconductor device comprising an RC-GBT with a ratio of 1:1 may as part of the development of the application modify the application such that a ratio of, e.g., 0.75:1 is subsequently needed. The customer in this case henceforth has to order different semiconductor chips or modules which, in most cases, will have to be redesigned specifically for the customer. This usually requires long design cycles. The change from one ratio to another is generally not possible seamlessly.

Figure 5:
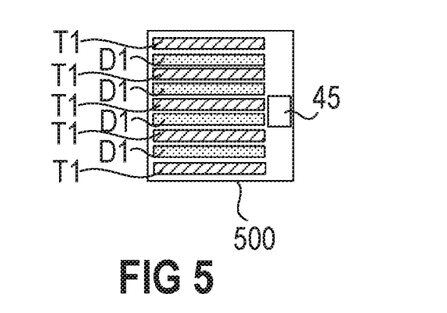
FIG. 5 schematically illustrates a top view of a semiconductor device according to one example.

Now referring to FIG. 5, a semiconductor device 500 is illustrated which provides a higher degree of flexibility for a customer. The semiconductor device 500 illustrated in FIG. 5 comprises a plurality of transistor sections T1 and a plurality of diode sections D1. While in conventional RC- IGBT devices all of the transistor sections T1 and all of the diode sections D1 are controlled simultaneously, the transistor sections T1 and the diode sections D1 of the device illustrated in FIG. 5 can be controlled individually. The semiconductor device 500 illustrated in FIG. 5 comprises a single gate pad 45. That is, when contacting the single gate pad 45, the gates of all of the individual transistor sections T1 will be controlled. While the transistor sections T1 in conventional RC-IGBT devices are coupled to each other (it is only possible to contact all transistor sections T1 simultaneously), the transistor sections T1 of the device of FIG. 5 are separated from each other (it is possible to contact the different transistor sections T1 separately). Further, the different transistor sections T1 may be separated from the different diode sections D1. Even further, the individual diode sections D1 are separated from each other. The overall ratio between the transistor part and the diode part is fixed for the semiconductor device 500. However, the transistor sections T1 essentially form different transistor devices coupled in parallel to each other. In particular, when all transistor sections T1 are active, the load paths of the different transistor sections T1 are coupled in parallel. Each of the load paths may be contacted individually. The same applies for the diode sections D1 which form a plurality of diodes coupled in parallel to each other as well as in parallel to the plurality of transistor devices. The different diode sections D1 may also be contacted individually.

If all transistor sections T1 and all diode sections D1 are contacted, this will result in the given overall ratio between transistor part and diode part. However, if only some but not all of the transistor sections T1 and/or only some but not all of the diode sections D1 are contacted, the ratio may be adapted. The given ratio if all transistor sections T1 and all diode sections D1 are contacted may be 1:1, for example. This, however, is only an example. Any other overall ratio (e.g., 1:3, 3:1, 1:0.5, 0.5:1, or 0.75:1) may be pre-set.

When contacting all of the gates of the different transistor sections T1 simultaneously by means of a common gate pad 45 (see FIG. 5), each of the different transistor sections T1 will be controlled with each switching operation. That is, a gate capacitance of the transistor sections T1 will charged or discharged with each switching operation, even if the load path of the respective transistor section T1 is not contacted (inactive). The semiconductor device 500 of FIG. 5, therefore, may be preferred if all of the transistor sections T1 are contacted and the ratio between the transistor part and the diode part of the semiconductor device 500 is only adapted by contacting only some but not all of the diode sections D1, for example.

Figure 6:
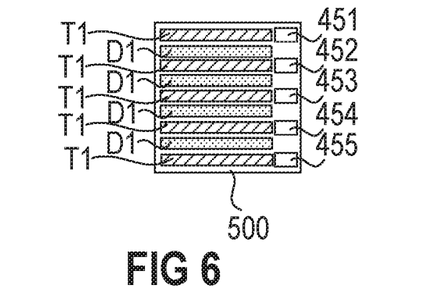
FIG. 6 schematically illustrates a top view of a semiconductor device according to another example.

If the number of active transistor sections T1 is to be varied as well as the number of active diode sections D1, or if only the number of active transistor sections T1 is to be varied, the semiconductor device 500 that is exemplarily illustrated in FIG. 6 may be used, for example. The semiconductor device 500 of FIG. 6 comprises a plurality of gate pads 45n. This allows to contact the individual gates of the different transistor sections T1 individually. Transistor sections T1 may be deliberately deactivated by means of shorting their respective gate and emitter, for example. In the example of FIG. 6, the gate capacitance of a transistor section T1 is not charged or discharged in correspondence with the switching operation, if the respective gate pad 45n is not electrically contacted.

The semiconductor devices 500 of FIGS. 5 and 6 allow a customer to easily and flexibly adjust the ratio between transistor part and diode part of the semiconductor device 500 without making a time consuming and expensive redesign of the semiconductor device 500 necessary. Performance and dimensioning of the semiconductor device 500 may be adjusted/amended within a short timeframe on customer side.

In the examples illustrated in FIGS. 5 and 6, the transistor sections T1 are separated from the diode sections D1. This, however, is only an example. According to another example (not specifically illustrated), it is also possible that a semiconductor device 500 comprises a plurality of individual combined sections that are separated from each other. Each of the plurality of individual combined sections may comprise a transistor part as well as a diode part. That is, by contacting one of the plurality of individual combined sections, a transistor sections and a diode section are simultaneously contacted. The transistor section and the diode section of a single one of the individual sections are not separated from each other in this example. By contacting the load path of a section but not the gate pad, the diode part of this individual section will be active but not the transistor part. In this way, the share of transistor sections may be reduced without reducing the share of diode sections, for example.

The semiconductor device 500 in the example of FIG. 6 comprises four diode sections D1, five transistor sections T1 and five gate pads 451, 452, 453, 454, 455. That is, all five transistor sections T1, only four, only three, only two or only one transistor sections T1 may be electrically contacted. The other sections that are not contacted remain inactive. The same applies for the diode sections D1. That is, all four diode sections D1, only three, only two or only one diode section D1 may be electrically contacted. The other diode sections that are not contacted remain inactive. A semiconductor device 500 comprising five individual transistor sections T1 and four individual diode sections D1, however, is only an example. Any other suitable number of transistor sections T1 and diode sections D1 is generally possible.

Figure 7:
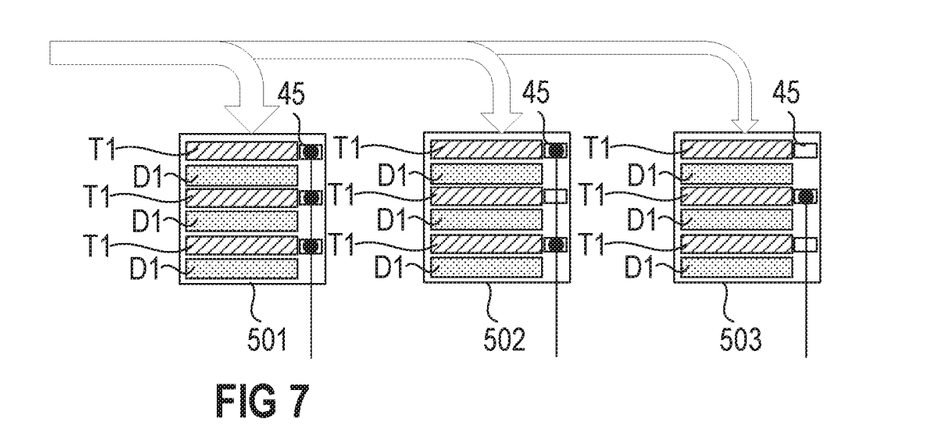
FIG. 7 schematically illustrates a top view of a plurality of exemplary semiconductor devices in a semiconductor arrangement according to one example.

In the example illustrated in FIG. 7, each of a plurality of semiconductor devices 501, 502, 503 comprises three transistor sections T1 and three diode sections D1. Three individual semiconductor devices 501, 502, 503 of a semiconductor arrangement are coupled in parallel in the example of FIG. 7. When contacting the different semiconductor devices of a single semiconductor arrangement, the distribution of the current to the individual semiconductor devices 501, 502, 503 may be asymmetrical. The asymmetrical distribution of the current may result from an asymmetric design of the semiconductor arrangement. The asymmetric distribution of the current is schematically illustrated with the bold arrows in FIG. 7. A first one of the semiconductor devices 501 may receive the highest current (marked with the thickest bold arrow), a second one of the semiconductor devices 502 may receive a current that is smaller than the current received at the first semiconductor device 501 (marked with the middle bold arrow), and a third semiconductor device 503 may receive a current that is even smaller than the current received by the second semiconductor device 502 (marked with the thinnest bold arrow).

In order to compensate for the different load currents, the active transistor and diode area of a semiconductor device 501, 502, 503 may be adjusted accordingly. For example, the entire transistor and diode area of the first semiconductor device 501 which receives the greatest load current may be activated. Within the second transistor device 502 which receives a lower load current, only some but not all of the transistor and diode area may be activated. While all three gate pads 45 of the first semiconductor device 501 are contacted in the example of FIG. 7, only two of the gate pads 45 of the second semiconductor device 502 are contacted. Within the third semiconductor device 503 which receives the lowest load current, even less of the transistor and diode area may be activated. In the example of FIG. 7, only one gate pad of the third semiconductor device 503 is contacted. That is, the less current flows through a semiconductor device of a semiconductor arrangement, the less transistor and diode area may be activated. In this way, the losses occurring within the semiconductor devices and therefore the resulting temperature ripple may be adjusted and balanced.

However, the resulting ratio between active transistor parts and active diode parts within each of the semiconductor devices 501, 502, 503 of the parallel connection may be identical. That is, if the first semiconductor device 501 has a resulting ratio between the transistor area and the diode area of 1:1, for example, the second semiconductor device 502 as well as the third semiconductor device 503 will also have a resulting ratio between the transistor area and the diode area of 1:1, irrespective of the number of transistor sections T1 and diode sections D1 that is activated in the respective semiconductor device. Any other resulting ratios are also possible, as has been explained above.

It is, however, also possible that an asymmetry of a plurality of parallel semiconductor devices 501, 502, 503 results from a difference in the control of the gates of the transistor devices 501, 502, 503. In such a case, the asymmetry may be compensated by using semiconductor devices 500 according to the example of FIG. 5. In this case, the resulting ratio between the active transistor area and the active diode area again may be identical for each of the semiconductor devices 501, 502, 503 of a parallel connection. However, even if the load path of one or more of the transistor sections T1 is not electrically connected (inactive), the gate of this transistor section T1 will be still contacted because of the single gate pad 45 contacting all of the individual transistor sections T1 simultaneously (see FIG. 5). Contacting the gate of an inactive transistor section T1 does not result in an activation of the respective transistor section T1 or an increase of the activated transistor area. However, the gate capacity of such an inactive transistor section T1 would be charged and discharged with each switching operation of the transistor device 500, as has already been described above. This reduces or counteracts the effects of the asymmetric control of the gates of the semiconductor devices 501, 502, 503 of the parallel connection.

Generally speaking and regardless of the kind of semiconductor devices 500 that is used in a semiconductor arrangement (e.g., semiconductor devices 500 according to the example of FIG. 5, or semiconductor devices 500 according to the example of FIG. 6), each inactive transistor section T1 constitutes a thermal capacity which improves the thermal impedance Zth at least within the short time range.

Figure 8:
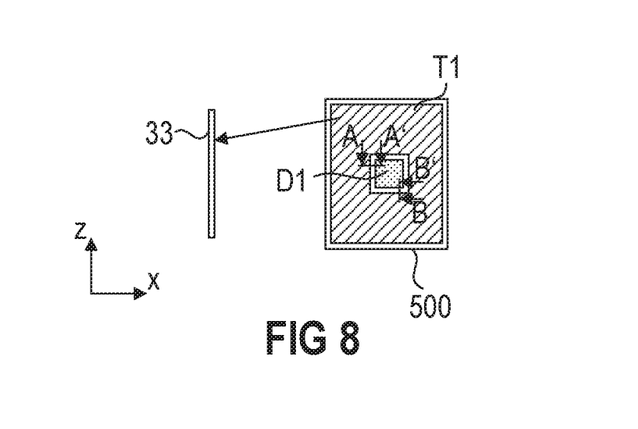
FIG. 8 schematically illustrates a top view of a semiconductor device according to another example.

Now referring to FIG. 8, a semiconductor device 500 comprising a transistor section T1 and a diode section D1 is exemplarily illustrated. The diode section D1 forms an island within the transistor section T1 and is separated from the transistor section T1. This, however, is only an example. According to another example, it is also possible that a transistor section T1 forms an island within a diode section D1. The top view illustrated in FIG. 8 only represents a section of a semiconductor device 500 (e.g., semiconductor device 500 according to FIG. 4).

Figure 9:
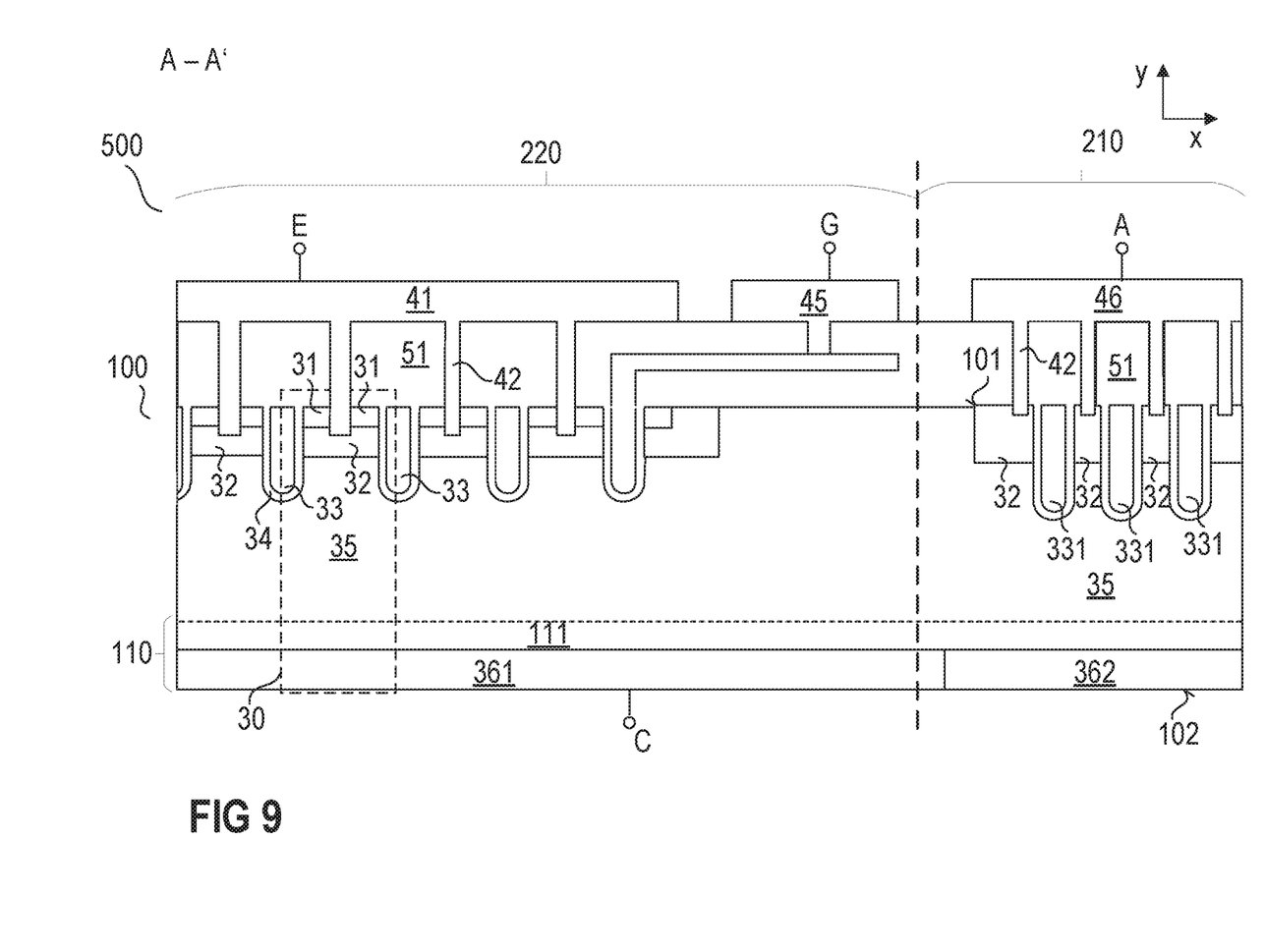
FIG. 9 schematically illustrates a cross-sectional view of the semiconductor device of FIG. 8 along a section plane A-A' according to one example.

A cross-sectional view of the semiconductor device 500 of FIG. 8 along a section plane A-A' according to one example is schematically illustrated in FIG. 9. The semiconductor device 500 comprises a semiconductor body 100. The semiconductor body 100 may include a conventional semiconductor material such as, for example, silicon (Si), silicon carbide (SiC), gallium nitride (GaN), gallium arsenide (GaAs), or the like. A transistor device is formed in the semiconductor body 100, the transistor device being arranged in a transistor section 220 of the semiconductor body 100. In FIG. 9, only a small section of the transistor device is shown. In its transistor section 220, the semiconductor body 100 includes at least one working transistor cell 30 with at least one gate electrode 33 that is separated from a body region 32 by a gate dielectric 34. The body region 32 is a doped semiconductor region in the transistor section 220 of the semiconductor body 100. In the example illustrated in FIG. 9, the body region 32 extends from a first surface 101 into the semiconductor body 100. Each of the at least one gate electrode 33 is arranged in a trench that extends from the first surface 101 of the semiconductor body 100 into the semiconductor body 100. Each of the transistor cells 30 further includes an emitter region 31 extending from the first surface 101 into the body region 32.

The transistor device illustrated in FIG. 9 further includes a drift region 35 formed in the semiconductor body 100. The drift region 35 adjoins the body region 32 of the at least one transistor cell 30 and forms a pn-junction with the body region 32. The drift region 35 is arranged between the body region 32 of the at least one transistor cell 30 and a collector region 361. The collector region 361 may be separated from the drift region 35 by a buffer region 111. The collector region 361 and the buffer region 111 may form a semiconductor layer 110 that is arranged between a second surface 102 of the semiconductor body 100 and the drift region 35. The second surface 102 is arranged opposite to the first surface 101 in a vertical direction y of the semiconductor body 100. The collector region 361 usually is a continuous region that is common for all of the plurality of transistors cells 30.

The buffer region 111 may be of the same doping type as the drift region 35, but more highly doped than the drift region 35. The buffer region 111 may be formed by a single layer or by a plurality of separate sub-layers, e.g., at least two sub-layers (not specifically illustrated). Sub-layers that are arranged closer to the drift region 35 may be less highly doped than sub-layers that are arranged further away from the drift region 35. For example, a doping concentration of a sub-layer that is arranged adjacent to the drift region 35 may be selected from a range of between 1E15 and 1E16 cm$^{-3}$ or lower. A doping concentration of a sub-layer that is arranged adjacent to the collector region 361 may be higher than a doping concentration of a sub-layer that is arranged horizontally above. The doping concentration of the sub-layer that is arranged adjacent to the collector region 361, however, may be lower than a doping concentration of the collector region 361. Generally speaking, a doping concentration of different sub-layers of the buffer region 111 may increase from the drift region 35 towards the collector region 361.

The transistor device illustrated in FIG. 9 comprises a plurality of trenches extending into the semiconductor body 100, wherein each of the plurality of gate electrodes 33 is arranged in one of the trenches. That is, the transistor cells 30 of the transistor device illustrated in FIG. 9 are trench transistor cells, in contrast to transistor cells of planar transistor devices. In planar transistor devices the gate electrodes 33 may be arranged in the dielectrically insulating layer 51 above the first surface 101 (a planar transistor device is not specifically illustrated in the Figures). The general structure of planar transistor cells, however, is similar to the structure of the trench transistor cells 30 that have been described with respect to FIG. 9 above.

Still referring to FIG. 9, the transistor device further includes an emitter electrode 41. The emitter electrode 41 is electrically connected to the emitter regions 31 and the body regions 32 of the at least one transistor cell 30 by means of contact plugs 42. The contact plugs 42 may comprise at least one of tungsten, aluminum, copper, and a T1/TiN barrier liner, for example. This emitter electrode 41 forms an emitter node E or is electrically connected to an emitter node E of the transistor device. The contact plugs 42 that are arranged below the emitter electrode 41 extend from the emitter and body regions 31, 32 through the insulation layer 51 that is formed on the top surface 101 of the semiconductor body 100 to the emitter electrode 41. The transistor device further includes a collector node C electrically connected to the collector region 361. A collector electrode electrically connected to the collector region 361 may form the collector node C. However, such collector electrode is not explicitly illustrated in FIG. 9.

The transistor device can be an n-type transistor device or a p-type transistor device. The device type is defined by the doping type of the emitter region 31. In an n-type transistor device, the emitter region 31 is an n-type region, the body region 32 is a p-type region, and the drift region 35, which has a doping type complementary to the doping type of the body region 32, is an n-type region. In a p-type transistor device, the emitter region 31 is a p-type region, and the body region 32 is an n-type region, the drift region 35 is a p-type region. The collector region 361 has a doping type complementary to the doping type of the drift region 35. For example, a doping concentration of the collector region 361 is selected from a range of between 1E18 and 1E19 cm$^{-3}$, 1E18 and 1E20 cm$^{-3}$, or 1E18 and 1E21 cm$^{-3}$, a doping concentration of the drift region 35 is selected from a range of between 1E15 and 5E16 cm$^{-3}$, and a doping concentration of the body region 32 is selected from between 5E 16 cm$^{-3}$ and 5E17 cm$^{-3}$.

In the transistor device explained above, a plurality of transistor cells 30 is connected in parallel. That is, the emitter regions 31 of these transistor cells 30 are connected to the emitter node E, the common collector region 361 is connected to the collector node C, and the at least one gate electrode 33 is connected to a gate electrode or gate pad 45. The gate pad 45 forms a gate node G or is electrically connected to a gate node G of the transistor device. The gate pad 45 may be formed in the transistor section 220 of the transistor device, for example.

The transistor section 220 comprising transistor cells 30 as illustrated in FIG. 9, however, is only an example. It is also possible that some of the gate electrodes 33 are inactive. Such inactive gate electrodes 33 may also be referred to as dummy trenches 331. This is exemplarily illustrated in FIG. 10. The dummy trenches 331 and gate trenches 33 may be arranged alternatingly within the transistor section 220. That is, each dummy trench 331 may have a neighboring gate trench 33 on each side in the vertical direction x. A section between the transistor section 220 and the diode section 210, as well as the diode section 210, only comprise dummy trenches 331 but no active gate electrodes 33. The dummy trenches 331 and gate electrodes 33 extend from the first surface 101 through the body region 32 into the semiconductor body 100. Emitter regions 31 of a doping type complementary to the doping type of the body region 32 are arranged between the gate trenches 33 and the emitter electrode 41. The drift region 35 and any elements and regions arranged between the drift region 35 and the second surface 102 are not explicitly illustrated in FIG. 10. Such elements generally correspond to what has been described with respect to FIG. 9 above.

Figure 10:
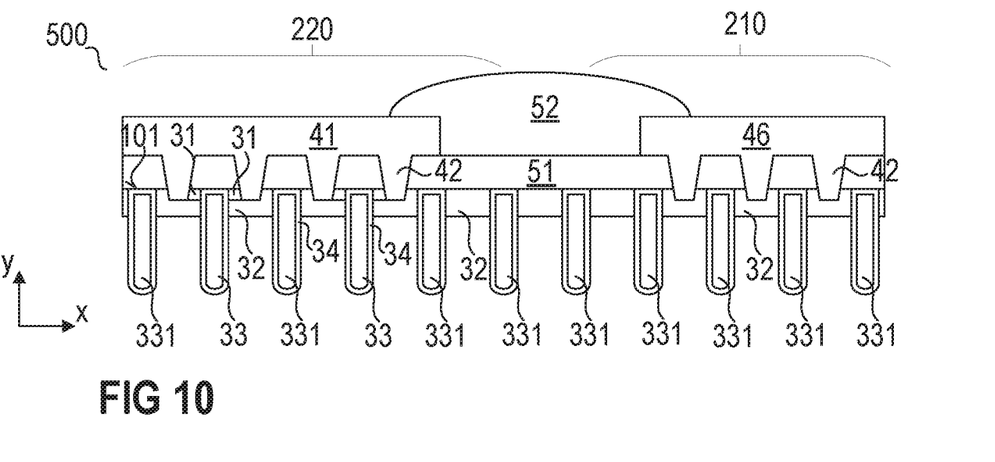
FIG. 10 schematically illustrates a cross-sectional view of the semiconductor device of FIG. 8 along a section plane A-A' according to another example.

Now referring to FIGS. 9 and 10, a semiconductor body 100 comprising at least one reverse conducting transistor device comprises not only a transistor section 220, but also a diode section 210. A diode device comprising at least one diode cell may be implemented in the diode section 210. The diode section 210 may be implemented similar to the transistor section 220. However, the gate electrodes 33 are omitted in the diode section 210, as has already been described with respect to FIG. 10 above. The same, however, applies for example of FIG. 9. The anode region 32 in the diode section 210 is similar to the body region 32 of the transistor section 220 and has a doping type complementary to the doping type of the drift region 35. An anode electrode 46 is formed on the semiconductor body 100. The anode electrode 46 is electrically coupled to the anode region 32 by means of contact plugs 42. The buffer region 111 is also present in the diode section 210. The doping types of the anode region 32, the drift region 35, and the buffer region 111 correspond to the doping types that have been described with respect to the transistor section 220 before. However, the collector region 361 of the transistor section 220 is replaced by a cathode region 362 in the diode section 210, the cathode region 362 having a doping type that corresponds to the doping type of the buffer region 111 and is complementary to the doping type of the collector region 361. The cathode region 362 generally is more highly doped than the buffer region 111.

The gate electrodes 33, the dummy trenches 331, and the emitter regions 31 may be implemented as elongated regions that have a length in a second horizontal direction z that is significantly larger than a width of the respective region in the first horizontal direction x. This is exemplarily illustrated by means of a gate electrode 33 in the top view of FIG. 8. For the sake of transparency, the exemplary gate electrode 33 is illustrated separated from the semiconductor device 500 just to illustrate the general orientation of the gate electrode 33.

Figure 11:
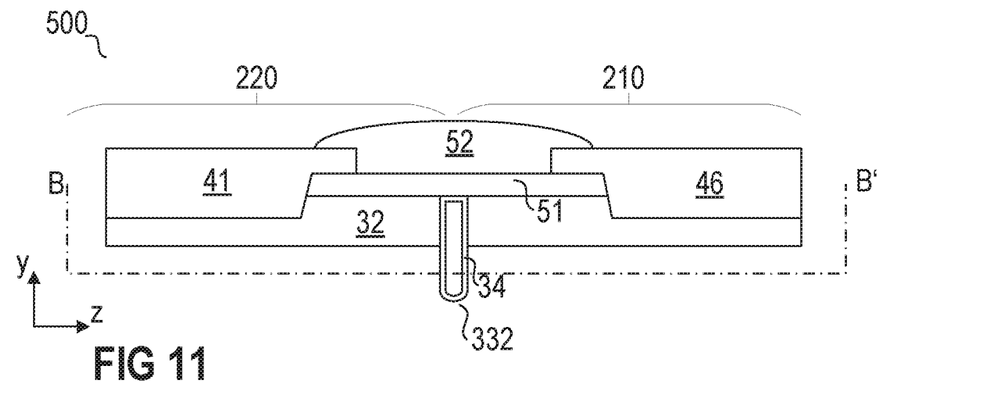
FIG. 11 schematically illustrates a cross-sectional view of the semiconductor device of FIG. 8 along a section plane B-B'.

A cross-sectional view of the exemplary semiconductor device 500 of FIG. 8 along a section plane B-B' is schematically illustrated in FIG. 11. As the diode section 210 is implemented as an island within the transistor section 220, that is, the diode section 210 is surrounded by the transistor section 220 in a horizontal plane, a boundary between the transistor section 220 and the diode section 210 also runs in the first horizontal direction x. As has been described above, the elongated gate electrodes 33 extend in the second horizontal direction z. The same applies for the dummy trenches 331 and emitter regions 31. Gate electrodes 33, dummy trenches 331 and emitter regions 31 are not specifically illustrated in FIG. 11, as the cross-sectionB-B' runs through the semiconductor device 500 in a region where no gate electrodes 33, dummy trenches 331 or emitter regions 31 are arranged. The emitter electrode 41 and the anode electrode 46 are separated by a ditch or trench between them. This ditch or trench may be filled with at least one layer of electrically insulating material. In the example of FIG. 11, a first layer of electrically insulating material 51 and a second layer of electrically insulating material 52 are schematically illustrated, filling the ditch or trench between the emitter electrode 41 and the anode electrode 46. The first layer of electrically insulating material 51 may correspond to the dielectrically insulating layer 51 that has been described with respect to FIG. 9 above. The first layer of electrically insulating material 51 is arranged between the second layer of electrically insulating material 52 and the body region 32. The second electrically insulating layer 52 may be an additional layer comprising, e.g., an imide. Such a second electrically insulating layer 52 may also be arranged in the ditch or trench between the emitter electrode 41 and the anode electrode 46 of FIG. 10. Within the semiconductor body 100, the transistor section 220 and the diode section 210 in the second horizontal direction may be electrically separated by a bridging section 332 of a dummy trench 331.

Figure 12:
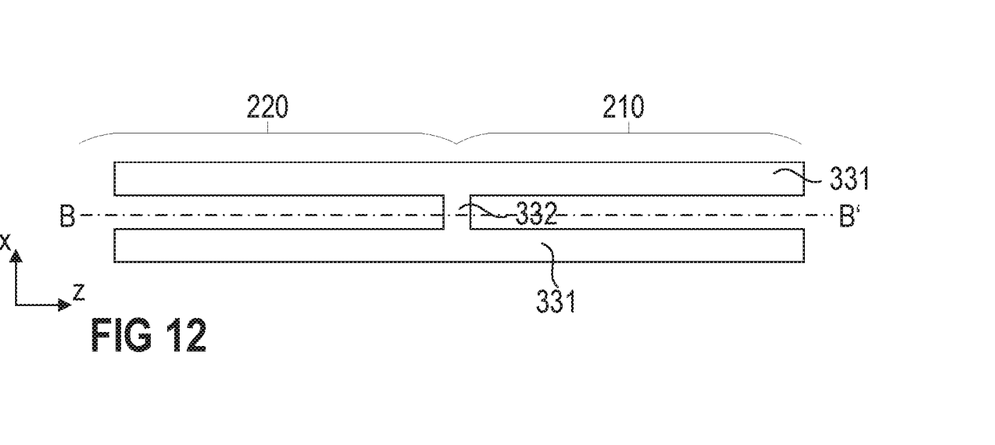
FIG. 12 schematically illustrates a top view of a detail of the semiconductor device of FIG. 8 indicating the course of section plane B-B'.

A top view of a dummy trench 331 is exemplarily illustrated in FIG. 12. In FIG. 12 only two neighboring dummy trenches 331 are schematically illustrated. Any other elements are omitted in FIG. 12 for the sake of transparency. As has been described above, the dummy trenches 331 may be elongated regions extending in the second horizontal direction z. In the range of the boundary between the transistor section 220 and the diode section 210, a bridging section 332 may be provided that extends in the first horizontal direction x between two neighboring dummy trenches 331 and separates the transistor section 220 and the diode section 210 in the second horizontal direction z. This bridging section 332 is exemplarily illustrated in the cross-sectional view of FIG. 11.

A selection or adjustment of the active transistor area and the active diode area of a semiconductor device 500 as has been described above may be carried out by a user of the semiconductor device 500 by electrically contacting the desired number of transistor sections T1 and the desired number of diode sections D1. Specifically, those transistor sections T1 and diode sections D1 that are to be active may be contacted by means of bonding wires, bonding tapes, clips, foils, pins, selective soldering, or any other suitable electrical connection, for example. The transistor device formed in the semiconductor body 100 may be any kind of reverse conducting bipolar transistor or any kind of reverse conducting unipolar transistor. Further, the transistor device formed in the semiconductor body 100 may be any kind of reverse conducting transistor as a combination of a bipolar transistor and a unipolar diode. Instead of an IGBT device, as has been described above, a MOSFET device in combination with a bipolar diode may be included in the semiconductor body 100. A selection of the amount of active transistor sections 220 and active diode sections 210 may occur by selectively contacting the respective electrodes 41, 45, 46, 361, 362 on the first surface 101 and/or on the second surface 102.

Figure 13:
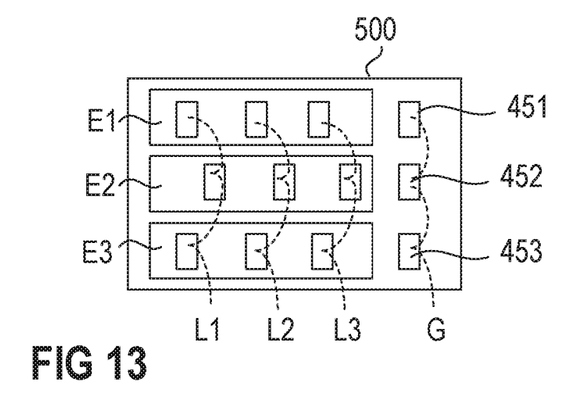
FIG. 13 schematically illustrates a top view of a semiconductor device according to a further example.

Now referring to FIG. 13, a semiconductor device 500 according to one example is schematically illustrated. The semiconductor device 500 comprises three transistor sections, each transistor section comprising an emitter electrode En. That is, in the top view of FIG. 13, a first emitter electrode E1, a second emitter electrode E2, and a third emitter electrode E3 are schematically illustrated. The transistor sections are separated from each other. The semiconductor device 500 further comprises three diode sections (not specifically illustrated). Each diode section is assigned to a different one of the transistor sections. When electrically contacting a transistor section, the corresponding diode section will automatically be electrically contacted as well. That is, when electrically contacting the transistor section related to the first emitter electrode E1, a first diode section will be electrically contacted as well. When electrically contacting the transistor section related to the second emitter electrode E2, a second diode section will be electrically contacted as well, and when electrically contacting the transistor section related to the third emitter electrode E3, a third diode section will be electrically contacted as well. The transistor sections each have a separate gate pad 451, 452, 453.

By selectively contacting the emitter electrodes E1, E2, E3 and/or the gate pads 451, 452, 453, a resulting ratio between an active transistor area and an active diode area of the semiconductor device 500 may be adjusted. Each of the combined transistor and diode sections may have a certain pre-set ratio between transistor part and diode part of, e.g., 4:3, 3:2, or 2:1. Any other pre-set ratios, however, are also possible. In an example wherein each of the combined transistor and diode regions comprises a pre-set ratio between an active transistor area and an active diode area of 3:2, when electrically contacting all three emitter electrodes E1, E2, E3 but only one of the gate pads 451, 452, 453, e.g., only gate pad 451 but not gate pads 452, 453, a resulting overall ratio between an active transistor area and an active diode area of the semiconductor device 500 will be 1:2. For each of the emitter electrodes E1, E2, E3 that is not electrically contacted, the overall diode part may be reduced by ⅓.

Figure 14:
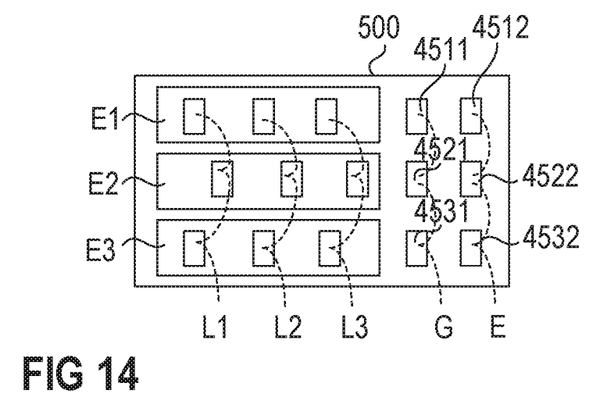
FIG. 14 schematically illustrates a top view of a semiconductor device according to an even further example.

Now referring to FIG. 14, a semiconductor device 500 is schematically illustrated which allows to use the semiconductor device 500 either as a reverse conducting transistor with (e.g., RCDC IGBT) or without (e.g., RCD IGBT) diode control. This may be achieved by providing two separate gate pads for each of the combined transistor and diode sections. For example, the first transistor and diode section which is assigned to the first emitter electrode E1, comprises a first gate pad 4511 and a second gate pad 4512. The first gate pad 4511 may electrically contact the gate electrodes 33 of the transistor section, and the second gate pad 4512 may electrically contact the dummy trenches 331 of the diode section. By coupling the second gate pad 4512 with the first gate pad 4511 (second gate pad 4512 on gate potential), the semiconductor device 500 may be used as a diode-controlled device. By coupling the second gate pad 4512 to the emitter electrode E1, (second gate pad 4512 on emitter/source potential), the semiconductor device 500 may be used as a device without diode control.

In the second case (second gate pad 4512 on emitter/source potential), additional emitter regions 31 may be implemented in the diode section 210. When electrically connecting the dummy trenches 331 arranged adjacent to such additional emitter regions 31 (not specifically illustrated in the Figures), the dummy trenches 331 in the diode region 210 remain inactive and the semiconductor device 500 functions, e.g., as an RCD-IGBT. In the first case (second gate pad 4512 on gate potential), the dummy trenches 331 of the diode section 210 are electrically connected to the gate electrodes 33 of the transistor section 220. This results in the formation of conducting channels in the diode section 210 which influence the diode characteristics of the diode section 210.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a plurality of transistor sections that are separated from each other, wherein each of the plurality of transistor sections comprises an emitter electrode and a collector electrode; and
   a plurality of diode sections that are separated from each other, wherein each of the plurality of diode sections comprises an anode electrode and a cathode electrode,
   wherein each of the plurality of transistor sections is electrically coupled to a common gate pad,
   wherein a ratio between an active transistor part and an active diode part of the semiconductor device is adjustable by activating a first number of the transistor sections by selectively contacting the emitter electrodes and the collector electrodes of the first number of transistor sections, and by activating a second number of the diode sections by selectively contacting the anode electrodes and the cathode electrodes of the second number of diode sections.

2. The semiconductor device of claim 1, wherein the ratio between the active transistor part and the active diode part of the semiconductor device represents a ratio between a nominal current through the active transistor sections and a nominal current through the active diode sections.

3. The semiconductor device of claim 1, wherein each of the plurality of diode sections is separated from each of the plurality of transistor sections.

4. The semiconductor device of claim 1, further comprising a plurality of combined sections that are separated from each other, wherein each of the combined sections comprises one of the plurality of transistor sections and one of the plurality of diode sections, and wherein when the emitter electrode and the collector electrode of the transistor section of a combined section are electrically contacted, the anode electrode and the cathode electrode of the diode section of the same combined section are electrically contacted simultaneously.

5. The semiconductor device of claim 4, wherein each of the plurality of combined sections comprises a single gate pad, and wherein when the emitter electrode and the collector electrode of the transistor section of a combined section are electrically contacted and, at the same time, the single gate pad of the same combined section is not electrically contacted, the diode section of the combined section is active while the transistor section of the combined section is inactive.

6. The semiconductor device of claim 4, wherein each of the plurality of combined sections comprises a first gate pad electrically contacting the transistor section and a second gate pad electrically contacting the diode section of the combined section, wherein when the second gate pad of a combined section is electrically coupled to the first gate pad of the same combined section, the combined section represents a reverse conducting transistor device with diode control, and wherein when the second gate pad of a combined section is electrically coupled to the emitter electrode of the same combined section, the combined section represents a reverse conducting transistor device without diode control.

7. The semiconductor device of claim 1, wherein each of the plurality of transistor sections comprises a transistor device implemented as a MOSFET or an IGBT.

8. A semiconductor device, comprising:
   a plurality of transistor sections that are separated from each other, wherein each of the plurality of transistor sections comprises an emitter electrode, a collector electrode, and a gate pad; and
   a plurality of diode sections that are separated from each other, wherein each of the plurality of diode sections comprises an anode electrode and a cathode electrode,
   wherein a ratio between an active transistor part and an active diode part of the semiconductor device is adjustable by activating a first number of the transistor sections by selectively contacting the emitter electrodes, the collector electrodes, and the gate pads of the first number of transistor sections, and by activating a second number of the diode sections by selectively contacting the anode electrodes and the cathode electrodes of the second number of diode sections.

9. The semiconductor device of claim 8, wherein the ratio between the active transistor part and the active diode part of the semiconductor device represents a ratio between a nominal current through the active transistor sections and a nominal current through the active diode sections.

10. The semiconductor device of claim 8, wherein each of the plurality of diode sections is separated from each of the plurality of transistor sections.

11. The semiconductor device of claim 8, further comprising a plurality of combined sections that are separated from each other, wherein each of the combined sections comprises one of the plurality of transistor sections and one of the plurality of diode sections, and wherein when the emitter electrode and the collector electrode of the transistor section of a combined section are electrically contacted, the anode electrode and the cathode electrode of the diode section of the same combined section are electrically contacted simultaneously.

12. The semiconductor device of claim 11, wherein each of the plurality of combined sections comprises a single gate pad, and wherein when the emitter electrode and the collector electrode of the transistor section of a combined section are electrically contacted and, at the same time, the single gate pad of the same combined section is not electrically contacted, the diode section of the combined section is active while the transistor section of the combined section is inactive.

13. The semiconductor device of claim 11, wherein each of the plurality of combined sections comprises a first gate pad electrically contacting the transistor section and a second gate pad electrically contacting the diode section of the combined section, wherein when the second gate pad of a combined section is electrically coupled to the first gate pad of the same combined section, the combined section represents a reverse conducting transistor device with diode control, and wherein when the second gate pad of a combined section is electrically coupled to the emitter electrode of the same combined section, the combined section represents a reverse conducting transistor device without diode control.

14. The semiconductor device of claim 8, wherein each of the plurality of transistor sections comprises a transistor device implemented as a MOSFET or an IGBT.

15. A semiconductor arrangement comprising a plurality of identical semiconductor devices operatively coupled in parallel between a first electrical potential and a second electrical potential, wherein each of the plurality of semiconductor devices comprises:
   a plurality of transistor sections that are separated from each other, wherein each of the plurality of transistor sections comprises an emitter electrode, a collector electrode, and a gate pad; and a plurality of diode sections that are separated from each other, wherein each of the plurality of diode sections comprises an anode electrode and a cathode electrode, wherein a ratio between an active transistor part and an active diode part of each semiconductor device is adjustable by activating a first number of the transistor sections by selectively contacting the emitter electrodes, the collector electrodes, and the gate pads of the first number of transistor sections, and by activating a second number of the diode sections by selectively contacting the anode electrodes and the cathode electrodes of a second number of diode sections, wherein the ratio between the active transistor part and the active diode part is identical for all of the plurality of semiconductor devices, wherein the number of active transistor sections and active diode sections is different for at least two of the plurality of semiconductor devices.

16. The semiconductor arrangement of claim 15, wherein the number of active transistor sections and active diode sections is different for all of the plurality of semiconductor devices.

17. The semiconductor arrangement of claim 15, wherein the number of active transistor sections and active diode sections of a semiconductor device depends on a current through the respective semiconductor device.

18. The semiconductor arrangement of claim 15, wherein either each semiconductor device comprises a single gate pad that is common for all of the plurality of transistor sections of the respective semiconductor device, or each transistor section of the plurality of transistor sections of a semiconductor device comprises an individual gate pad.

19. The semiconductor arrangement of claim 15, wherein each semiconductor device comprises a plurality of combined sections that are dielectrically insulated from each other, wherein each of the combined sections comprises one of the plurality of transistor sections and one of the plurality of diode sections, and wherein when the emitter electrode and the collector electrode of the transistor section of a combined section are electrically contacted, the anode electrode and the cathode electrode of the diode section of the same combined section are electrically contacted simultaneously.

20. The semiconductor arrangement of claim 19, wherein each of the plurality of combined sections comprises a single gate pad, and wherein when the emitter electrode and the collector electrode of the transistor section of a combined section are electrically contacted and, at the same time, the single gate pad of the same combined section is not electrically contacted, the diode section of the combined section is active while the transistor section of the combined section is inactive.

21. The semiconductor arrangement of claim 19, wherein each of the plurality of combined sections comprises a first gate pad electrically contacting the transistor section, and a second gate pad electrically contacting the diode section of the combined section, wherein when the second gate pad of a combined section is electrically coupled to the first gate pad of the same combined section, the combined section represents a reverse conducting transistor device with diode control, and wherein when the second gate pad of a combined section is electrically coupled to the emitter electrode of the same combined section, the combined section represents a reverse conducting transistor device without diode control.

* * * * *